US012635318B2

(12) United States Patent
Zhao

(10) Patent No.: US 12,635,318 B2
(45) Date of Patent: May 19, 2026

(54) DISPLAY PANEL INCLUDING A SPLICED DISPLAY SCREEN

(71) Applicant: TCL CHINA STAR OPTOELECTRONICS TECHNOLOGY CO., LTD, Shenzhen (CN)

(72) Inventor: Yongchao Zhao, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 606 days.

(21) Appl. No.: 17/987,311

(22) Filed: Nov. 15, 2022

(65) Prior Publication Data

US 2024/0063351 A1     Feb. 22, 2024

(30) Foreign Application Priority Data

Aug. 16, 2022    (CN) .......................... 202210978602.9

(51) Int. Cl.
H10H 20/854          (2025.01)
H10H 20/01           (2025.01)
(Continued)

(52) U.S. Cl.
CPC .......... H10H 20/854 (2025.01); H10H 20/84 (2025.01); H10H 20/857 (2025.01);
(Continued)

(58) Field of Classification Search
CPC .. H10H 20/854; H10H 20/84; H10H 20/0364; H10H 20/853; H10H 20/034;
(Continued)

(56) References Cited

U.S. PATENT DOCUMENTS

| 10,431,717 B1 * | 10/2019 | Dasgupta ............. H10H 20/819 |
| 2008/0246107 A1 * | 10/2008 | Maehara ............... H10F 39/026 |
| | | 257/E31.127 |

(Continued)

FOREIGN PATENT DOCUMENTS

| CN | 204216046 U | 3/2015 |
| CN | 113539131 A | 10/2021 |

(Continued)

OTHER PUBLICATIONS

Chinese Office Action issued in corresponding Chinese Patent Application No. 202210978602.9 dated May 31, 2025, pp. 1-8.

*Primary Examiner* — William B Partridge
*Assistant Examiner* — Chevy J Boegel
(74) *Attorney, Agent, or Firm* — PV IP PC; Peter Stecher; Wei Te Chung

(57) ABSTRACT

A display panel, a method of manufacturing the same, and a spliced display screen are disclosed. A driving substrate includes a plurality of first signal wirings and a plurality of light-emitting devices arranged in an array on the driving substrate. Each of the light-emitting devices is electrically connected to a corresponding one of the first signal wirings on the driving substrate. A protective layer covers the light-emitting devices and the driving substrate. One end of each of the first signal wirings is exposed at the protective layer to form an exposed end. The cladding layer covers the exposed end of the first signal wiring, so that the first signal wiring can be prevented from being exposed to cause line corrosion, thus alleviating a problem of line corrosion caused by exposed metal wirings in current display panels.

15 Claims, 6 Drawing Sheets

(51) Int. Cl.

| | | |
|---|---|---|
| *H10H 20/84* | (2025.01) | |
| *H10H 20/857* | (2025.01) | |
| *H10P 74/00* | (2026.01) | |
| *H10P 74/20* | (2026.01) | |

(52) U.S. Cl.
CPC .......... *H10P 74/207* (2026.01); *H10P 74/273* (2026.01); *H10H 20/034* (2025.01); *H10H 20/0362* (2025.01)

(58) Field of Classification Search
CPC ..... H10H 20/0362; H01L 22/14; H01L 22/32; H01L 22/857; H01L 25/167; H01L 25/0753; G09G 3/006; G09G 3/32; G09G 2300/0426; G09F 9/302
See application file for complete search history.

(56) References Cited

U.S. PATENT DOCUMENTS

| | | | | |
|---|---|---|---|---|
| 2009/0278454 | A1 * | 11/2009 | Fedorovskaya ........ | G02B 5/288 |
| | | | | 313/512 |
| 2010/0140786 | A1 * | 6/2010 | Lee ......................... | H01L 21/56 |
| | | | | 257/E23.06 |
| 2016/0351550 | A1 * | 12/2016 | Sabathil ............... | H10H 20/854 |

FOREIGN PATENT DOCUMENTS

| | | | | | |
|---|---|---|---|---|---|
| CN | 114141792 | A | * | 3/2022 | ........... H10D 86/021 |
| JP | 2010140786 | A | * | 6/2010 | |
| WO | 2022062081 | A1 | | 3/2022 | |

* cited by examiner

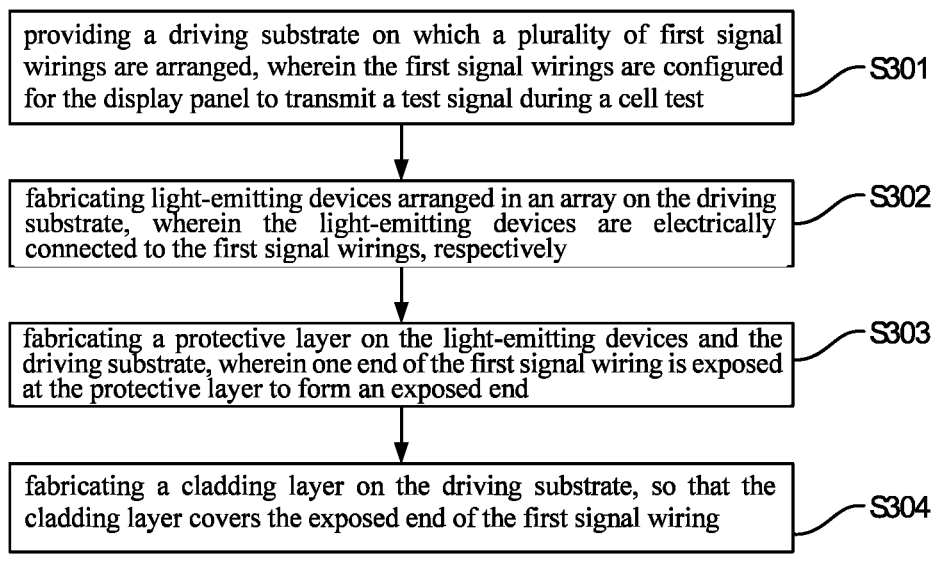

providing a driving substrate on which a plurality of first signal wirings are arranged, wherein the first signal wirings are configured for the display panel to transmit a test signal during a cell test — S301 fabricating light-emitting devices arranged in an array on the driving substrate, wherein the light-emitting devices are electrically connected to the first signal wirings, respectively — S302 fabricating a protective layer on the light-emitting devices and the driving substrate, wherein one end of the first signal wiring is exposed at the protective layer to form an exposed end — S303 fabricating a cladding layer on the driving substrate, so that the cladding layer covers the exposed end of the first signal wiring — S304

FIG. 5

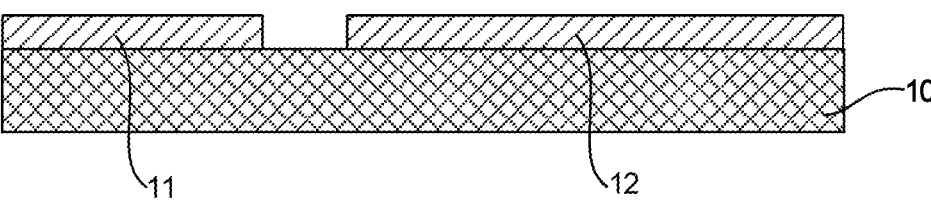

FIG. 6

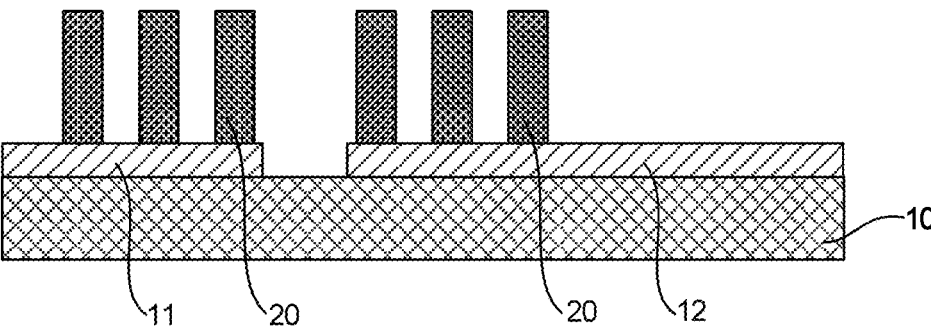

FIG. 7

DISPLAY PANEL INCLUDING A SPLICED DISPLAY SCREEN

CROSS REFERENCE TO RELATED APPLICATIONS

Pursuant to 35 U.S.C. § 119 and the Paris Convention Treaty, this application claims priority to China Patent Application No. 202210978602.9 filed Aug. 16, 2022, titled "DISPLAY PANEL AND METHOD OF MANUFACTURING SAME, AND SPLICED DISPLAY SCREEN", the disclosure of which is incorporated herein by reference in its entirety.

FIELD

The present application relates to a technical field of displays, and particularly to a display panel and a method of manufacturing the same, and a spliced display screen.

INTRODUCTION

Prior to entering module processes (Module), current micro light-emitting diode (LED) and mini LED display panels need to be subjected to a lighting test (cell test) to detect defects. For this purpose, test pads should be reserved on the display panels and electrically connected to metal wirings in the display panels. After the cell test is completed, the test pads need to be cut. However, after the test pads are cut, cut surfaces of the metal wirings electrically connected to the test pads will be exposed. The exposed metal wirings are in direct contact with water vapor and oxygen, which may easily lead to corrosion of the metal wirings, thereby causing abnormal performance of the display panels.

SUMMARY

An object of the present application is to provide a display panel, a method of manufacturing the same, and a spliced display screen, so as to alleviate a technical problem of line corrosion caused by exposed metal wirings in current display panels.

To overcome the above-mentioned problem, the present application provides a technical solution as follows:

An embodiment of the present application provides a display panel, including a driving substrate including a plurality of first signal wirings arranged on the driving substrate. Each of the first signal wirings is configured for the display panel to transmit a test signal during a cell test. A plurality of light-emitting devices are arranged in an array on the driving substrate, and each of the light-emitting devices electrically connected to a corresponding one of the first signal wirings on the driving substrate. A protective layer covers the light-emitting devices and the driving substrate. One end of the first signal wiring defines an exposed end exposed at the protective layer. A cladding layer covers the exposed end of the first signal wiring.

In the display panel according to an embodiment of present application, the cladding layer further surrounds and covers the driving substrate and the protective layer on the driving substrate.

In the display panel according to an embodiment of present application, the cladding layer has a water vapor transmission rate less than a water vapor transmission rate of the protective layer.

In the display panel according to an embodiment of present application, the display panel further includes a plurality of second signal wirings and a chip-on-film disposed on the driving substrate. The chip-on-film is electrically connected to the light-emitting devices through the second signal wirings, a spacing is formed between the chip-on-film and the protective layer, and the cladding layer surrounds and covers the chip-on-film and covers the second signal wirings in the spacing.

In the display panel according to an embodiment of present application, the cladding layer includes at least a first cladding layer, and the first cladding layer is a parylene coating or an inorganic coating.

In the display panel according to an embodiment of present application, the cladding layer further includes at least a second cladding layer surrounding and covering the first cladding layer. One of the first cladding layer or the second cladding layer is the parylene coating, and the other is the inorganic coating.

In the display panel according to an embodiment of present application, the cladding layer further includes at least a third cladding layer surrounding and covering the second cladding layer. The third cladding layer is made of a material same as that of the first cladding layer.

In the display panel according to an embodiment of present application, a thickness of the parylene coating ranges from 10 microns to 30 microns, and a thickness of the inorganic coating ranges from 20 angstroms to 60 angstroms.

An embodiment of the present application further provides a method of manufacturing a display panel, and the method includes providing a driving substrate on which a plurality of first signal wirings are arranged, and the first signal wirings being configured for the display panel to transmit a test signal during a cell test; fabricating light-emitting devices arranged in an array on the driving substrate, and the light-emitting devices being electrically connected to the first signal wirings, respectively; fabricating a protective layer on the light-emitting devices and the driving substrate, and one end of the first signal wiring being exposed at the protective layer to form an exposed end; and fabricating a cladding layer on the driving substrate, so that the cladding layer covers the exposed end of the first signal wiring.

In the method of manufacturing the display panel according to an embodiment of present application, the step of fabricating the cladding layer on the driving substrate includes forming an inorganic coating by depositing an inorganic material on the driving substrate and the protective layer on the driving substrate through atomic layer deposition, so as to form a first cladding layer; forming a parylene coating by depositing a parylene material on the first cladding layer through parylene vacuum deposition, so as to form a second cladding layer; and forming an inorganic coating by depositing an inorganic material on the second cladding layer through atomic layer deposition, so as to form a third cladding layer.

An embodiment of the present application further provides a spliced display screen, including a plurality of spliced display panels. The display panels each include the display panel of one of the foregoing embodiments.

The present application has advantageous effects as follows: in the display panel, the method of manufacturing the same, and the spliced display screen provided in the present application, the driving substrate is provided with the first signal wirings, the light-emitting devices are arranged in an array on the driving substrate, and each of the light-emitting devices is electrically connected to a corresponding one of the first signal wirings on the driving substrate. The protective layer covers the light-emitting device and the driving substrate, and one end of each of the first signal wirings is exposed at the protective layer to form the exposed end. The cladding layer covers the exposed end of the first signal wiring, so that the first signal wiring can be prevented from being exposed to cause line corrosion, thus solving a problem of line corrosion caused by exposed metal wirings in current display panels.

DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

FIG. 5 is a flowchart of a method of manufacturing a display panel according to an embodiment of the present application.

FIG. 6 is a schematic cross-sectional view of a driving substrate according to an embodiment of the present application.

FIG. 7 is a schematic cross-sectional view illustrating light-emitting devices bonded to the driving substrate of FIG. 6.

DETAILED DESCRIPTION

Figures 1, 2:
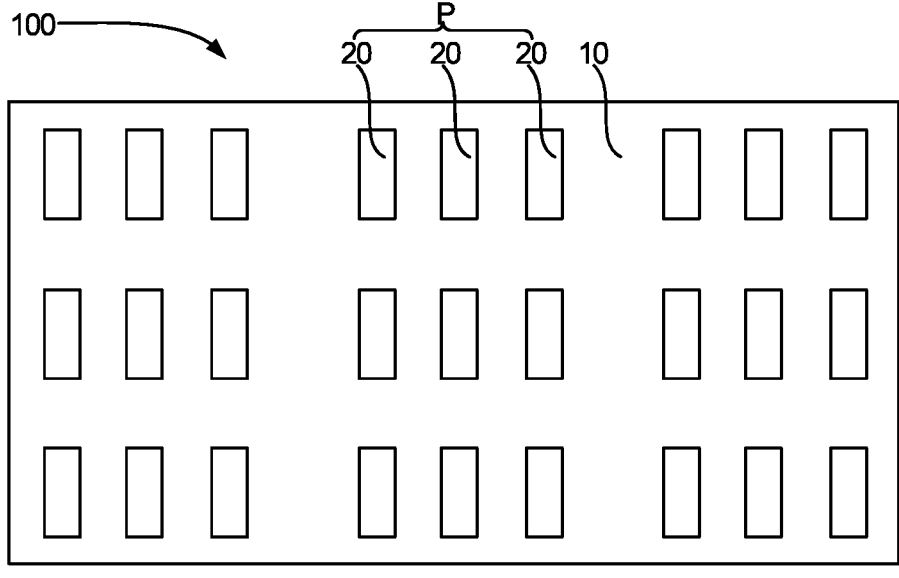
FIG. 1 is a schematic structural view of a display panel in a top view according to an embodiment of the present application.
FIG. 2 is a schematic cross-sectional view of a display panel according to an embodiment of the present application.

The following embodiments are referring to the accompanying drawings for exemplifying specific implementable embodiments of the present application. Directional terms described by the present application, such as upper, lower, front, back, left, right, inner, outer, side, etc., are only directions by referring to the accompanying drawings, and thus the used directional terms are used to describe and understand the present invention, but the present application is not limited thereto. In the drawings, units with similar structures are indicated by the same reference numerals. In the drawings, for clear understanding and ease of description, the thickness of some layers and regions are exaggerated. That is, the size and thickness of each component shown in the drawings are arbitrarily shown, but the application is not limited to this.

Figures 3, 4:
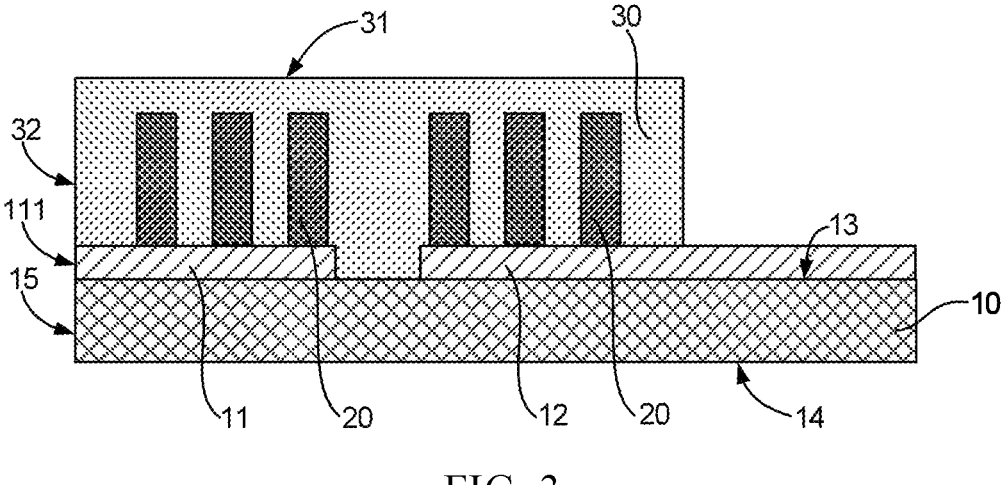
FIG. 3 is a schematic partial detailed view of a display panel according to an embodiment of the present application.
FIG. 4 is another schematic structural view of a display panel in a top view according to an embodiment of the present application.

Referring to FIGS. 1 to 3, FIG. 1 is a schematic structural view of a display panel in a top view according to an embodiment of the present application, FIG. 2 is a schematic cross-sectional view of a display panel according to an embodiment of the present application, and FIG. 3 is a schematic partial detailed view of a display panel according to an embodiment of the present application. The display panel 100 includes a driving substrate 10 and a plurality of light-emitting devices 20 arranged in an array on the driving substrate 10. Each of the light-emitting devices 20 is bonded to the driving substrate 10, and an interval is formed between two adjacent light-emitting devices 20.

The display panel 100 includes a plurality of pixels P arranged in an array, and each of the pixels P includes three of the light-emitting devices 20. An interval between adjacent ones of the pixels P is greater than a spacing distance between two adjacent light-emitting devices 20 in a same pixel P. The three light-emitting devices 20 of each pixel P emit light of different colors, and each of the light-emitting devices 20 is a subpixel. For example, the three light-emitting devices 20 emit red light, green light, and blue light, respectively. In this case, the light-emitting device 20 that emits red light is a red subpixel, the light-emitting device 20 that emits green light is a green subpixel, and the light-emitting device 20 that emits blue light is a blue subpixel. Certainly, the light-emitting devices 20 are not limited to the above in the present application. The three light-emitting devices 20 of each of the pixels P in the present application can also emit light of a same color. In this case, a quantum dot film or the like needs to be arranged in a light-emitting direction of the light-emitting device 20.

Optionally, the light-emitting device 20 includes a micro light-emitting diode (LED) chip or a mini LED chip or the like. The driving substrate 10 is provided with a plurality of first signal wirings 11 and second signal wirings 12. Each of the light-emitting devices 20 is electrically connected to a corresponding one of the first signal wirings 11 on the driving substrate 10, and the first signal wiring 11 is configured for the display panel 100 to transmit a test signal during a cell test. The second signal wirings 12 each provide a driving signal for the light-emitting device 20 to emit light. It should be noted that FIG. 2 only illustrates a connection relationship between the light-emitting device 20 and the first signal wiring 11 and the second signal wiring 12, and is not intended to distinguish which of the first signal wirings 11 or which of the second signal wirings 12 is connected to a corresponding one of the light-emitting devices 20. Certainly, in some embodiments, the first signal wiring 11 and the second signal wiring 12 may be a same signal wiring.

In one embodiment, the light-emitting device 20 operates in an active driving mode and is further provided with transistors (not shown). The light-emitting device 20 is electrically connected to a corresponding one of the transistors, and the transistor is further electrically connected to a corresponding one of the second signal wirings 12. The second signal wiring 12 provides the transistor with a driving signal to control the light-emitting device 20 to emit light, and the second signal wirings 12 includes a source driving signal line, etc. Certainly, in other embodiments, the light-emitting device 20 may also operate in a passive driving manner.

In order to protect the light-emitting devices 20 and flatten a level difference between the light-emitting devices 20, the display panel 100 further includes a protective layer 30. The protective layer 30 covers the light-emitting devices 20 and the driving substrate 10. One end of the first signal wiring 11 on the driving substrate 10 is exposed at the protective layer 30 to form an exposed end 111. A surface of the protective layer 30 away from the driving substrate 10 is a flat surface, and the surface of the protective layer 30 away from the driving substrate 10 exceeds a surface of the light-emitting devices 20 away from the driving substrate 10.

Specifically, referring to FIGS. 1 and 2, the protective layer 30 is filled in the interval between the pixels P and the space between the light-emitting devices 20 in a same pixel P. Optionally, the protective layer 30 is made of a material including at least one of transparent adhesive materials, such as epoxy resin and silica gel.

In addition, in order to provide driving signals for the second signal wirings 12, a chip-on-film (COF) 50 is bonded to one side of the driving substrate 10 and is electrically connected to the second signal wiring 12, so that the COF 50 is electrically connected to the light-emitting device 20 through the second signal wiring 12. A spacing is formed between the COF 50 and the protective layer 30 to prevent interference between the protective layer 30 and the COF 50.

It can be understood that, in order to reduce a bezel size of the display panel 100, the COF 50 can also be bent to a back surface 14 of the driving substrate 10. The back surface 14 of the driving substrate 10 is a surface of the driving substrate 10 away from the light-emitting device 20. For ease of description, as shown in FIG. 3, the present application defines a surface of the driving substrate 10 on which he light-emitting device 20 is bonded as a front surface 13 of the driving substrate 10, and defines the surface of the driving substrate 10 away from the light-emitting device 20 as the back surface 14 of the driving substrate 10. A surface of the driving substrate 10 connecting with the front surface 13 and the back surface 14 of the driving substrate 10 is a side surface 15 of the driving substrate 10.

Correspondingly, a surface of the protective layer 30 away from the driving substrate 10 is an upper surface 31 of the protective layer 30, and a surface of the protective layer 30 close to the driving substrate 10 is a lower surface of the protective layer 30. A surface of the protective layer 30 connecting with the upper surface 31 and the lower surface of the protective layer 30 is a side surface 32 of the protective layer 30. The definition of each surface of the light-emitting device 20 is same as the definition of each surface of the protective layer 30, and details are not repeated here.

Since the display panel 100 is required to perform a cell test, after the cell test is completed, one end of the first signal wiring 11 will be exposed at the protective layer 30 to form an exposed end 111, as shown in FIG. 3. Specifically, the exposed end 111 of the first signal wiring 11 is flush with the side surface 32 of the protective layer 30. In this way, the protective layer 30 cannot effectively protect the exposed end 111 of the first signal wiring 11, so that the exposed end 111 is in direct contact with water vapor or oxygen, resulting in corrosion of the metal wirings.

In order to prevent the exposure of the exposed end 111 of the first signal wirings 11 from leading to corrosion of the metal wirings, the display panel 100 of the present application further includes a cladding layer 40. The cladding layer 40 covers at least the exposed end 111 of the first signal wiring 11 to block the exposed end 111 of the first signal wiring 11 from contacting external water vapor or oxygen.

Optionally, the cladding layer 40 further surrounds and covers the driving substrate 10 and the protective layer 30 on the driving substrate 10, that is, the cladding layer 40 wraps the driving substrate 10, and the first signal wiring 11, the light-emitting device 20, the protective layer 30, and the COF 50 on the driving substrate 10 all together so as to isolate them from the outside.

By means of the cladding layer 40 surrounding and covering the protective layer 30, water and oxygen barrier properties of the protective layer 30 can be strengthened and an encapsulation effect of the display panel 100 can be improved. Particularly, in a case that the light-emitting device 20 is actively driven and the transistor driving the light-emitting device 20 uses an oxide semiconductor material as a semiconductor layer, by means of the cladding layer 40 surrounding and covering the protective layer 30, water and oxygen can be further blocked from entering the light-emitting device 20 and the semiconductor layer of the transistor through the protective layer 30, thereby preventing the light-emitting device 20 and the semiconductor layer of the transistor from failing due to intrusion of water and oxygen.

Optionally, a water vapor transmission rate (WVTR) of the cladding layer 40 is less than a water vapor transmission rate of the protective layer 30, so that the cladding layer 40 is better at blocking water and oxygen, thereby further enhancing a reinforcing effect on the water and oxygen barrier properties of the protective layer 30, and improving the encapsulation effect of the display panel 100.

Specifically, the cladding layer 40 includes at least a first cladding layer 41. The first cladding layer 41 is formed by depositing an inorganic coating through an atomic layer deposition (ALD) method on the driving substrate 10 and each device on the driving substrate 10. Materials of the inorganic coating include inorganic materials such as aluminum oxide ($Al_2O_3$), silicon nitride, silicon oxide, and zirconium oxide. The first cladding layer 41 formed by the atomic layer deposition is an entire surface film layer. Specifically, the first cladding layer 41 covers the back surface 14 and the side surface 15 of the driving substrate 10, the exposed end 111 of the first signal wiring 11, the side surface 32 and the upper surface 31 of the protective layer 30, surfaces of the COF 50 not in contact with the driving substrate 10, and the second signal wiring 12 located at the spacing between the COF 50 and the protective layer 30, so that the first cladding layer 41 wraps the driving substrate 10 and each device and each film layer on the driving substrate 10.

It can be understood that the protective layer 30 is made of a material including epoxy resin, silica gel, etc. Since the epoxy resin has better adhesion, higher cross-linking density, and better water vapor transmission rate, it can be better prevented water vapor from entering the device to ensure that the device can maintain good reliability in high temperature and high humidity tests. However, the epoxy resin will suffer from yellowing when exposed to high temperature or short wavelength light, thus adversely affecting optical quality of a product. Silica gel can withstand high temperature and short-wavelength light irradiation, but the adhesive force of the silica gel is relatively poor, making it easy to peel off the interface. In addition, crosslinking density of the silica gel is much smaller than that of an epoxy material, and a water vapor transmission rate of the silicone material is poor, so that the water vapor cannot be well blocked from entering the device, resulting in high temperature and high humidity, giving rise to a bad testing.

Based on this, the cladding layer 40 of the present application can well compensate for the defects of the protective layer 30. For example, when the first cladding layer 41 is formed by the atomic layer deposition method and a film forming temperature is less than 80° C., the protective layer 30 formed by the epoxy resin will not be affected, so that a yellowing phenomenon hardly occurs in the protective layer 30. In addition, the water vapor transmission rate of the first cladding layer 41 is less than the water vapor transmission rate of the protective layer 30. For example, the water vapor transmission rate of the first cladding layer 41 formed by the inorganic plating layer is less than 1*10-4 g/m2*24 h. In this way, the water and oxygen barrier properties of the protective layer 30 formed by using silica gel can be reinforced.

Further, a thickness of the first cladding layer 41 formed by the atomic layer deposition is relatively thin. When it covers the side surface 15 of the driving substrate 10, the exposed end 111 of the first signal wiring 11, and the side surface 32 of the protective layer 30, a bezel width of the display panel 100 will not be increased too much, which is more conducive to realizing a narrow bezel of the display panel 100. Optionally, the thickness of the first cladding layer 41 formed by the inorganic coating ranges from 20 angstroms to 60 angstroms.

In one embodiment, the first cladding layer 41 may also be formed by depositing a parylene coating on the driving substrate 10 and each device on the driving substrate 10 by using parylene vacuum coating. The parylene coating is made of material including parylene C powder (dichloro-paraxylene dimer, parylene C), parylene D powder (tetra-chloro-paraxylene dimer, parylene D), and the like. The water vapor transmission rate of the first cladding layer 41 formed by the parylene coating is less than 1*10-2 g/m2*24 h, and its film thickness range from 10 micros to 30 micron. Compared with a thicker thickness of the first cladding layer 41 formed by the inorganic coating, the first cladding layer 41 formed by the parylene coating can better prevent the display panel 100 from being damaged. Furthermore, a surface flatness of the parylene coating formed by the parylene vacuum coating is very good, so it can be used as a planarization layer to form a smooth surface.

In one embodiment, please refer to FIGS. 1 to 4. FIG. 4 is another schematic structural view of a display panel in a top view according to an embodiment of the present application. Different from the above-mentioned embodiment, the cladding layer 40 of the display panel 101 includes a multi film layers. Specifically, the cladding layer 40 further includes at least a second cladding layer 42. The second cladding layer 42 surrounds and covers the first cladding layer 41, wherein one of the first cladding layer 41 or the second cladding layer 42 is the parylene coating, and the other one is the inorganic coating. In this embodiment, the first cladding layer 41 is the inorganic coating and the second cladding layer 42 is the parylene coating as an example. A thickness of the first cladding layer 41 ranges from 20 angstroms to 60 angstroms. angstroms, and a thickness of the second cladding layer 42 ranges from 10 microns to 30 microns.

In one embodiment, the cladding layer 40 further includes at least a third cladding layer 43 surrounding and covering the second cladding layer 42. Specifically, the third cladding layer 43 is made of a material same as that of the first cladding layer 41. For example, the first cladding layer 41 is the inorganic coating, and the third cladding layer 43 is also the inorganic coating. A thickness of the third cladding layer 43 ranges from 20 angstroms to 60 angstroms.

In this way, the cladding layer 40 has a multi-layered structure including the inorganic coatings and the parylene coating alternately arranged in a stacked manner, so that the cladding layer 40 is imparted with a superior capability to block water and oxygen and can better protect the first signal wiring 11 and further enhance the reinforcing effect on the water and oxygen barrier properties of the protective layer 30. In addition, the second cladding layer 42 formed by the parylene coating is located between the first cladding layer 41 and the third cladding layer 43 both formed by the inorganic coating, which can increase a length of a water and oxygen permeation channel, release stress between the inorganic coatings, and can further cover inevitable impurity particles.

Figure 8:
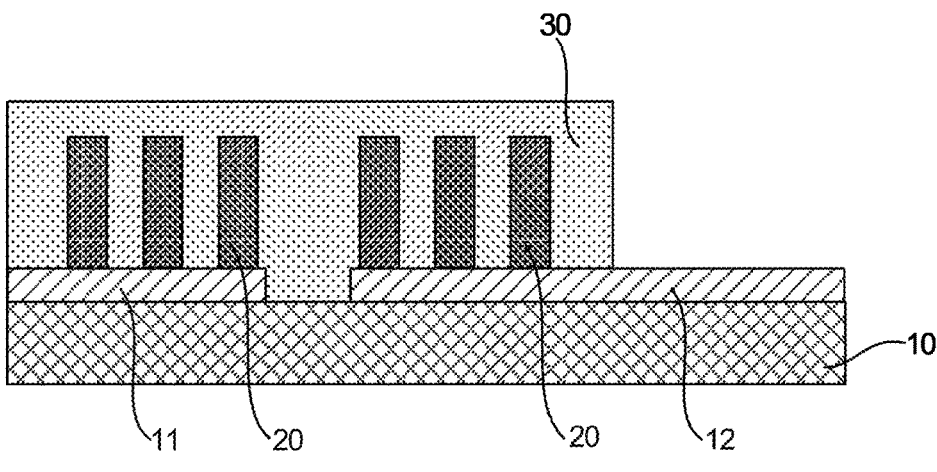
FIG. 8 is a schematic cross-sectional view illustrating a protective layer covering a structure of FIG. 7.
Figure 9:
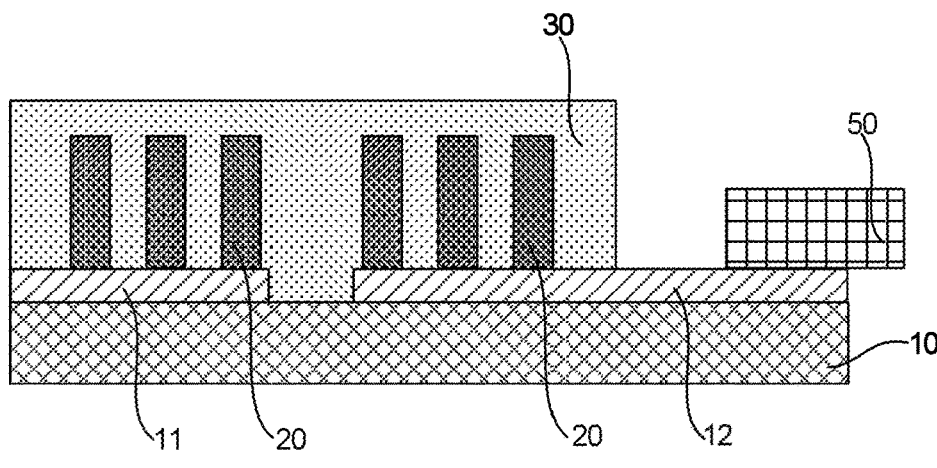
FIG. 9 is a schematic cross-sectional view illustrating a chip-on-film bonded to the structure of FIG. 7.
Figure 10:
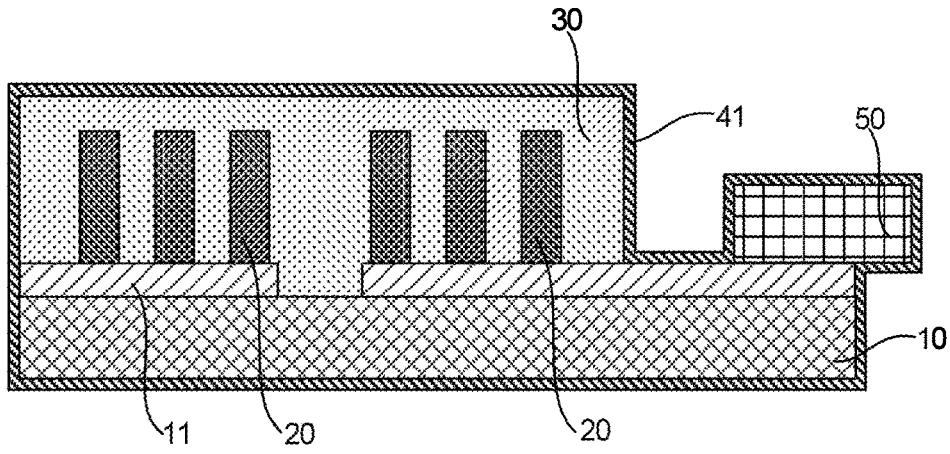
FIG. 10 is a schematic cross-sectional view illustrating a first cladding layer fabricated on a structure of FIG. 9.
Figure 11:
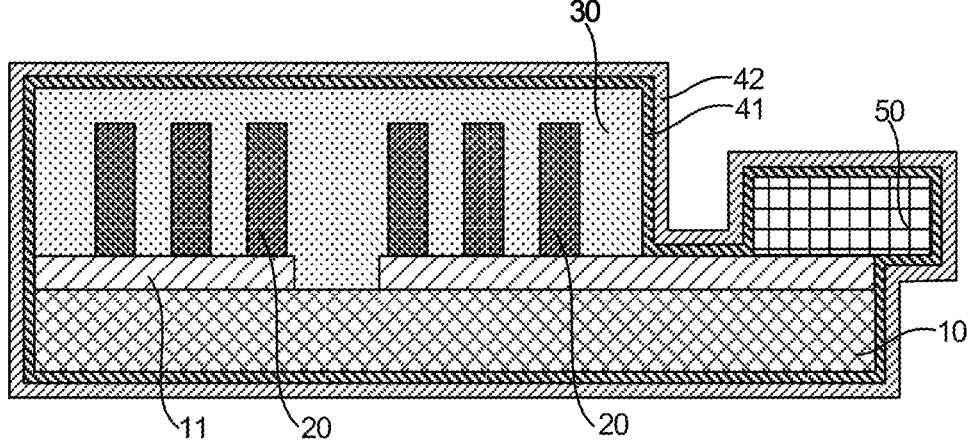
FIG. 11 is a schematic cross-sectional view illustrating a second cladding layer fabricated on a structure of FIG. 10.
Figure 12:
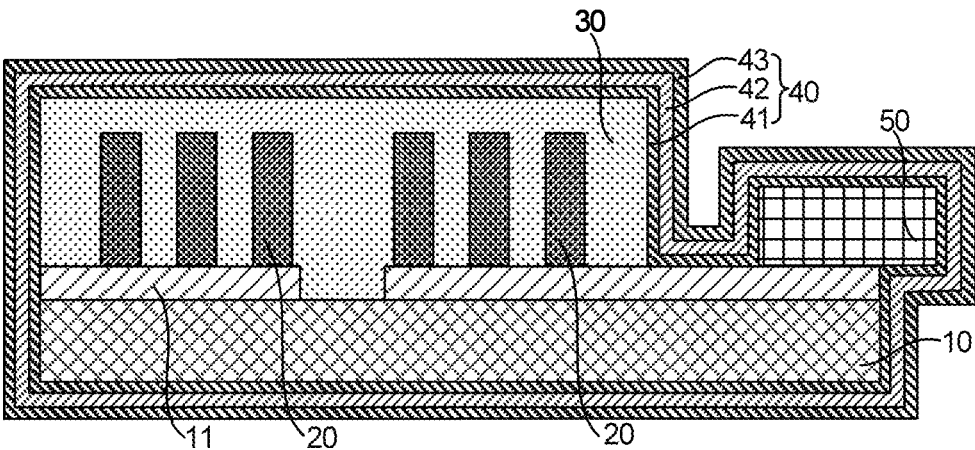
FIG. 12 is a schematic cross-sectional view illustrating a third cladding layer fabricated on a structure of FIG. 11.
Figure 13:
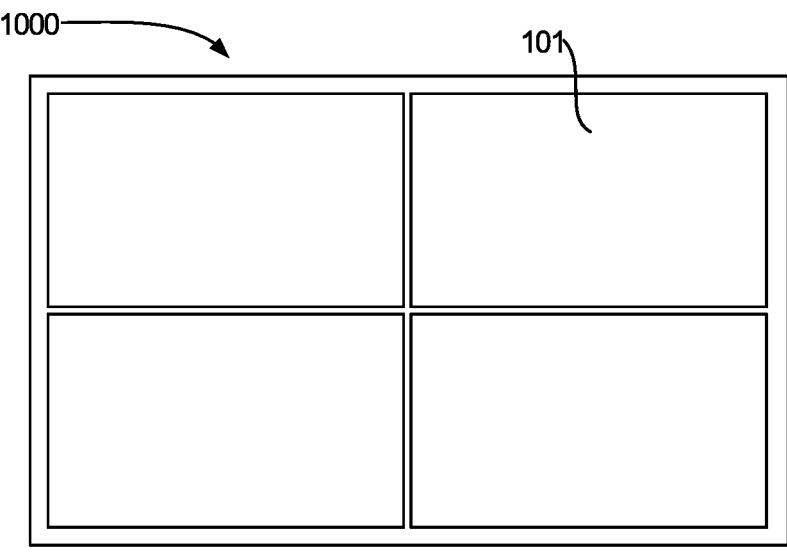
FIG. 13 is a schematic structural view of a spliced display screen in a top view according to an embodiment of the present application.

In one embodiment, a method of manufacturing a display panel is further provided. Please refer to FIGS. 1 to 12. FIG. 5 is a flowchart of a method of manufacturing a display panel according to an embodiment of the present application. FIG. 6 is a schematic cross-sectional view of a driving substrate according to an embodiment of the present application. FIG. 7 is a schematic cross-sectional view illustrating light-emitting devices bonded to the driving substrate of FIG. 6. FIG. 8 is a schematic cross-sectional view illustrating a protective layer covering a structure of FIG. 7. FIG. 9 is a schematic cross-sectional view illustrating a chip-on-film bonded to the structure of FIG. 7. FIG. 10 is a schematic cross-sectional view illustrating a first cladding layer fabricated on a structure of FIG. 9. FIG. 11 is a schematic cross-sectional view illustrating a second cladding layer fabricated on a structure of FIG. 10. FIG. 12 is a schematic cross-sectional view illustrating a third cladding layer fabricated on a structure of FIG. 11. A method of manufacturing the display panel includes:

S301: providing a driving substrate 10 on which a plurality of first signal wirings 11 are arranged, wherein the first signal wirings are configured for the display panel to transmit a test signal during a cell test.

Specifically, as shown in FIG. 6, the driving substrate 10 is provided with the first signal wiring 11 and the second signal wiring 12. The first signal wiring 11 is configured for the display panel to transmit a test signal during a cell test, and the second signal wiring 12 is configured to provide a driving signal for the light emission of the display panel. Certainly, in some embodiments, the first signal wiring 11 and the second signal wiring 12 may be a same signal wiring.

S302: fabricating light-emitting devices 20 arranged in an array on the driving substrate 10, wherein the light-emitting devices 20 are electrically connected to the first signal wirings 11, respectively.

Specifically, the light-emitting devices 20 arranged in an array are fabricated on a transfer substrate, and the light-emitting devices 20 include micro LED chips or mini LED chips. Then, the light-emitting devices 20 are transferred to the driving substrate 10, so that each of the light-emitting devices 20 is bound to the driving substrate 10, and there is an interval formed between adjacent two of the light-emitting devices 20, as shown in FIG. 7. In addition, each of the light-emitting devices 20 is electrically connected to a corresponding one of the first signal wirings 11. The first signal wiring 11 is configured for the display panel to transmit the test signal during the cell test. Furthermore, each of the light-emitting devices 20 is further electrically connected to a corresponding one of the second signal wirings 12, and the second signal wiring 12 provides a driving signal for the light-emitting device 20 to emit light.

S303: fabricating a protective layer 30 on the light-emitting devices 20 and the driving substrate 10, wherein one end of the first signal wiring 11 is exposed at the protective layer 30 to form an exposed end 111.

Specifically, the protective layer 30 is formed by covering the driving substrate 10 and the light-emitting device 20 with an encapsulating adhesive material by a molding or glue spraying process, as shown in FIG. 8. Specifically, a transparent encapsulation material, such as epoxy resin or silicone, is filled in the intervals between the light-emitting devices 20 by the molding or glue spraying process and is configured to encapsulate the light-emitting devices 20 thus forming the protective layer 30. The protective layer 30 covers the upper surface and side surface of the light-emitting device 20, part of the surface of the first signal wiring 11, and part of the surface of the driving substrate 10. Furthermore, the upper surface 31 of the protective layer 30 is beyond the upper surfaces of the light-emitting devices 20.

Further, in order to provide driving signals for the second signal wirings 12, one side of the driving substrate 10 is further bonded with a COF 50, which is electrically connected to the second signal wirings 12, as shown in FIG. 9. A spacing is formed between the COF 50 and the protective layer 30 to prevent interference between the protective layer 30 and the COF 50. It can be understood that, in order to reduce a bezel side of the display panel 100, the COF 50 can further be bent to the back surface 14 of the driving substrate 10.

S304: fabricating a cladding layer 40 on the driving substrate 10, so that the cladding layer 40 covers the exposed end 111 of the first signal wiring 11.

Specifically, an inorganic coating is formed by depositing an inorganic material on the driving substrate 10 and the protective layer 30 on the driving substrate 10 through atomic layer deposition, so as to form a first cladding layer 41, as shown in FIG. 10. The first cladding layer 41 formed by the atomic layer deposition is an entire surface film layer. Specifically, the first cladding layer 41 sequentially covers the back surface 14 and the side surface 15 of the driving substrate 10, the exposed end 111 of the first signal wiring 11, the side surface 32 and the upper surface 31 of the protective layer 30, surfaces of the COF 50 not in contact with the driving substrate 10, and the second signal wiring 12 located at the spacing between the COF 50 and the protective layer 30, so that the first cladding layer 41 wraps the driving substrate 10 and each device and each film layer on the driving substrate 10. In this way, the exposed end 111 of the first signal wiring 11 can be prevented from being exposed to cause corrosion of the metal wirings.

Optionally, the inorganic coating is made of material including an inorganic material, such as $Al_2O_3$, silicon nitride, silicon oxide, zirconium oxide, etc. Inorganic materials have good water and oxygen barrier properties, so the water vapor transmission rate of the first cladding layer 41 formed by the inorganic coating is less than the water vapor transmission rate of the protective layer 30. For example, the water vapor transmission rate of the first cladding layer 41 is less than the water vapor transmission rate of the protective layer 30. For example, the water vapor transmission rate of the first cladding layer 41 formed by the inorganic plating layer is less than $1*10-4$ g/m2*24 h. In this way, the water and oxygen barrier properties of the protective layer 30 formed by using silica gel can be reinforced. In this case, when the first cladding layer 41 is formed by the atomic layer deposition method and a film forming temperature is less than 80° C., the protective layer 30 formed by the epoxy resin will not be affected, so that a yellowing phenomenon hardly occurs in the protective layer 30.

Optionally, the thickness of the first cladding layer 41 formed by the inorganic coating ranges from 20 angstroms to 60 angstroms. In this way, when the first cladding layer 41 covers the side surface 15 of the driving substrate 10, the exposed end 111 of the first signal wiring 11, and the side surface 32 of the protective layer 30, a bezel width of the display panel will not be excessively increased, which is more conducive to achieving a narrow bezel of the display panel, thereby facilitating splicing of a plurality of the display panels.

Further, a parylene coating layer is formed by using parylene vacuum coating to deposit parylene material on the first cladding layer 41 to form a second cladding layer 42, so that the second cladding layer 42 surrounds and covers the first cladding layer 41, as shown in FIG. 11. The parylene coating is made of material including parylene C powder, parylene D powder, and the like. The water vapor transmission rate of the second cladding layer 42 formed by the parylene coating is less than $1*10-2$ g/m2*24 h, and its film thickness range from 10 micros to 30 micron. Compared with a thicker thickness of the first cladding layer 41 formed by the inorganic coating, the second cladding layer 42 formed by the parylene coating can better prevent the display panel from being damaged. Furthermore, a surface flatness of the parylene coating formed by the parylene vacuum coating is very good, so it can be used as a planarization layer to form a smooth surface.

Further, an inorganic coating is formed by depositing an inorganic material on the second cladding layer 42 through atomic layer deposition, so as to form a third cladding layer 43, so that the third cladding layer 43 surrounds and covers the second cladding layer 42, as shown in FIG. 12. The third cladding layer 43 is made of material same as that of the first cladding layer 41. A thickness of the third cladding layer 43 ranges from 20 angstroms to 60 angstroms, and a water vapor transmission rate of the third cladding layer 43 is less than $1*10-4$ g/m2*24 h.

In this way, the cladding layer 40 has a multi-layered structure including the inorganic coatings and the parylene coating alternately arranged in a stacked manner, so that the cladding layer 40 is imparted with a superior capability to block water and oxygen and can better protect the first signal wiring 11 and further enhance the reinforcing effect on the water and oxygen barrier properties of the protective layer 30. In addition, the second cladding layer 42 formed by the parylene coating is located between the first cladding layer 41 and the third cladding layer 43 both formed by the inorganic coating, which can increase a length of a water and oxygen permeation channel, release stress between the inorganic coatings, and can further cover inevitable impurity particles.

Based on the same inventive concept, an embodiment of the present application further provides a spliced display screen. Referring to FIGS. 1 to 13, FIG. 13 is a schematic structural view of a spliced screen in a top view according to an embodiment of the present application. The spliced display screen 1000 includes a plurality of display panels 101. The display panels 101 each include the display panels 101 in one of the foregoing embodiments. This embodiment is described by taking the display panels 101 as an example. When the display panels 101 are used to form the spliced display screen, since the cladding layer 40 of the display panel 101 is formed by the atomic layer deposition method and/or parylene vacuum coating, a film thickness of the cladding layer 40 is made thinner, so that the bezel of the display panel 101 cannot be enlarged too much on the premise of protecting the first signal wiring 11. Therefore, a splicing seam of the spliced display screen 1000 formed by splicing the display panels 101 is relatively small.

It should be noted that, in order to prevent the cladding layer 40 from affecting the connection between the chip-on-film 50 on the display panel 101 and an external circuit during a splicing process of the display panel 101, an opening (not shown) is formed in the cladding layer 40 corresponding to where the chip-on-film 50 needs to be connected to the external circuit. For example, when fabricating the cladding layer 40, a shielding member such as a jig can be used to shield a position where the chip-on-chip film 50 needs to be connected to an external circuit to form the opening, thereby preventing the cladding layer 40 from affecting the splicing of the display panel 101.

According to the above embodiments, it can be known that:

In the display panel, the method of manufacturing the same, and the spliced display screen provided in the present application, the driving substrate is provided with the first signal wirings, the light-emitting devices are arranged in an array on the driving substrate, and each of the light-emitting devices is electrically connected to a corresponding one of the first signal wirings on the driving substrate. The protective layer covers the light-emitting device and the driving substrate, and one end of each of the first signal wirings is exposed at the protective layer to form the exposed end. The cladding layer surrounds and covers the driving substrate and the exposed end of the first signal wiring and the protective layer on the driving substrate, so that the first signal wiring can be prevented from being exposed to cause line corrosion, thus solving a problem of line corrosion caused by exposed metal wirings in current display panels.

In the above-mentioned embodiments, the description of each embodiment has its own emphasis. For parts that are not described in detail in an embodiment, reference may be made to related descriptions of other embodiments.

The above describes the embodiments of the present application in detail. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. A display panel, comprising:
a driving substrate comprising a plurality of first signal wirings and a plurality of second signal wirings arranged on the driving substrate, wherein each of the first signal wirings is configured for the display panel to transmit a test signal during a cell test;
a plurality of light-emitting devices arranged in an array on the driving substrate, and each of the light-emitting devices electrically connected to a corresponding one of the first signal wirings on the driving substrate;
a protective layer covering the light-emitting devices and the driving substrate, wherein ends of the first signal wirings are exposed at the protective layer;
a chip-on-film disposed on the driving substrate; wherein the chip-on-film is electrically connected to the light-emitting devices through the second signal wirings, a spacing is defined between the chip-on-film and the protective layer to expose a part of the second signal wirings; and
a cladding layer, wherein the cladding layer covers a back surface and side surfaces of driving substrate, exposed ends of the first signal wirings, side surfaces and an upper surface of the protective layer, surfaces of the chip-on-film not in contact with the driving substrate, and the part of the second signal wirings exposed at the spacing.

2. The display panel of claim 1, wherein the cladding layer comprises at least a first cladding layer, and the first cladding layer is a parylene coating or an inorganic coating.

3. The display panel of claim 1, wherein the cladding layer has a water vapor transmission rate less than a water vapor transmission rate of the protective layer.

4. The display panel of claim 3, wherein the cladding layer comprises at least a first cladding layer, and the first cladding layer is a parylene coating or an inorganic coating.

5. The display panel of claim 4, wherein the cladding layer further comprises at least a second cladding layer surrounding and covering the first cladding layer, wherein one of the first cladding layer or the second cladding layer is the parylene coating, and the other is the inorganic coating.

6. The display panel of claim 5, wherein the cladding layer further comprises at least a third cladding layer surrounding and covering the second cladding layer, wherein the third cladding layer is made of a material same as that of the first cladding layer.

7. The display panel of claim 5, wherein a thickness of the parylene coating ranges from 10 microns to 30 microns, and a thickness of the inorganic coating ranges from 20 angstroms to 60 angstroms.

8. A method of manufacturing a display panel, comprising:
providing a driving substrate on which a plurality of first signal wirings and a plurality of second signal wirings are arranged;
fabricating light-emitting devices arranged in an array on the driving substrate, and electrically connecting the light-emitting devices to the first signal wirings, respectively;
fabricating a protective layer on the light-emitting devices and the driving substrate, and exposing ends of the first signal wirings at the protective layer;
fabricating a chip-on-film on the driving substrate, electrically connecting the chip-on-film to the light-emitting devices through the second signal wirings, and forming a space between the chip-on-film and the protective layer to expose a part of the second signal wirings; and
fabricating a cladding layer on the driving substrate to cover a back surface and side surfaces of driving substrate, exposed ends of the first signal wirings, side surfaces and an upper surface of the protective layer, surfaces of the chip-on-film not in contact with the driving substrate, and the part of the second signal wirings exposed at the spacing;
wherein the display panel comprises:
the driving substrate comprising the plurality of first signal wirings and the plurality of second signal wirings arranged on the driving substrate, wherein each of the first signal wirings is configured for the display panel to transmit a test signal during a cell test;
the plurality of light-emitting devices arranged in an array on the driving substrate, and each of the light-emitting devices electrically connected to a corresponding one of the first signal wirings on the driving substrate;
the protective layer covering the light-emitting devices and the driving substrate, wherein ends of the first signal wirings are exposed at the protective layer; and the chip-on-film disposed on the driving substrate; wherein the chip-on-film is electrically connected to the light-emitting devices through the second signal wirings, the spacing is defined between the chip-on-film and the protective layer to expose the part of the second signal wirings; and the cladding layer, wherein the cladding layer covers the back surface and the side surfaces of driving substrate, the exposed ends of the first signal wirings, the side surfaces and the upper surface of the protective layer, the surfaces of the chip-on-film not in contact with the driving substrate, and the part of the second signal wirings exposed at the spacing.

9. The method of manufacturing the display panel of claim 8, wherein the step of fabricating the cladding layer on the driving substrate comprises:

forming an inorganic coating by depositing an inorganic material on the driving substrate and the protective layer on the driving substrate through atomic layer deposition, so as to form a first cladding layer;

forming a parylene coating by depositing a parylene material on the first cladding layer through parylene vacuum deposition, so as to form a second cladding layer; and forming an inorganic coating by depositing an inorganic material on the second cladding layer through atomic layer deposition, so as to form a third cladding layer.

10. A spliced display screen, comprising a plurality of display panels spliced together, wherein each of the display panels comprises:

a driving substrate comprising a plurality of first signal wirings and a plurality of second signal wirings arranged on the driving substrate, wherein each of the first signal wirings is configured for the display panel to transmit a test signal during a cell test;

a plurality of light-emitting devices arranged in an array on the driving substrate, and each of the light-emitting devices electrically connected to a corresponding one of the first signal wirings on the driving substrate;

a protective layer covering the light-emitting devices and the driving substrate, wherein ends of the first signal wirings are exposed at the protective layer;

a chip-on-film disposed on the driving substrate; wherein the chip-on-film is electrically connected to the light-emitting devices through the second signal wirings, a spacing is defined between the chip-on-film and the protective layer to expose a part of the second signal wirings; and a cladding layer, wherein the cladding layer covers a back surface and side surfaces of driving substrate, exposed ends of the first signal wirings, side surfaces and an upper surface of the protective layer, surfaces of the chip-on-film not in contact with the driving substrate, and the part of the second signal wirings exposed at the spacing.

11. The spliced display screen of claim 10, wherein the cladding layer has a water vapor transmission rate less than a water vapor transmission rate of the protective layer.

12. The spliced display screen of claim 10, wherein the cladding layer comprises at least a first cladding layer, and the first cladding layer is a parylene coating or an inorganic coating.

13. The spliced display screen of claim 12, wherein the cladding layer further comprises at least a second cladding layer surrounding and covering the first cladding layer, wherein one of the first cladding layer or the second cladding layer is the parylene coating, and the other is the inorganic coating.

14. The spliced display screen of claim 13, wherein the cladding layer further comprises at least a third cladding layer surrounding and covering the second cladding layer, wherein the third cladding layer is made of a material same as that of the first cladding layer.

15. The spliced display screen of claim 13, wherein a thickness of the parylene coating ranges from 10 microns to 30 microns, and a thickness of the inorganic coating ranges from 20 angstroms to 60 angstroms.

* * * * *